United States Patent [19]

Nolan

[11] Patent Number: 4,540,940

[45] Date of Patent: Sep. 10, 1985

[54] CIRCUIT TESTER FOR AUTOMOTIVE ELECTRICAL SYSTEMS

[76] Inventor: David C. Nolan, 2525 Virginia St., Omaha, Nebr. 68147

[21] Appl. No.: 478,323

[22] Filed: Mar. 24, 1983

[51] Int. Cl.³ .............................................. G01R 31/02
[52] U.S. Cl. ...................................... 324/133; 324/51
[58] Field of Search ..................... 340/641, 650, 652; 324/133, 51, 52

[56] References Cited

U.S. PATENT DOCUMENTS

| | | | |
|---|---|---|---|
| 2,994,819 | 8/1961 | Vincent | 324/51 |
| 3,074,013 | 1/1963 | Bowden | 324/51 |
| 3,145,337 | 8/1964 | Lipson | 324/51 X |
| 3,363,171 | 1/1968 | Sietmann | 324/51 |
| 3,553,572 | 1/1971 | Harmon | 324/51 X |
| 3,704,411 | 11/1972 | Jamieson | 324/53 |
| 3,723,863 | 3/1973 | Myers | 324/51 |
| 3,728,617 | 4/1973 | Potter | 324/51 |
| 3,753,090 | 8/1973 | Tomek | 324/53 |
| 3,798,540 | 3/1974 | Darden | 324/51 |
| 3,829,763 | 8/1974 | Morin | 324/51 |
| 3,973,193 | 8/1976 | Hayes | 324/51 |
| 4,021,732 | 5/1977 | Metcalf | 324/53 |
| 4,028,621 | 6/1977 | Bloxam | 324/133 |
| 4,207,517 | 6/1980 | Bloxam | 324/133 |
| 4,210,862 | 7/1980 | Koslar | 324/133 |
| 4,249,125 | 2/1981 | Carver | 324/51 |

FOREIGN PATENT DOCUMENTS 0731401 4/1980 U.S.S.R. .............................. 324/133

Primary Examiner—Stanley T. Krawczewicz
Assistant Examiner—Jose M. Solis
Attorney, Agent, or Firm—Zarley, McKee, Thomte, Voorhees & Sease

[57] ABSTRACT

A circuit tester for automotive electrical systems comprising a body member of "pistol-grip" configuration having an electrical socket at one end thereof and an electrically conductive probe extending from the other end thereof. An electrical lead is provided for connecting the terminals of the automobile battery to the socket. The lead has a plug at one end thereof which is reversibly receivable by the socket to enable the tester to be placed in either a positive test mode or a negative test mode. A first electrical lead member extends through the body member from the socket to the probe and has a light imposed therein. A second electrical lead extends from the socket to the probe but has a normally open, manually operated switch imposed therein. The second electrical lead member also has a replaceable fuse assembly imposed therein. The light will be illuminated when the switch is closed whether or not the probe is in electrical contact with the electrical system of the automobile or a component thereof. The light will be illuminated when the switch is opened and the probe is in electrical contact with the automobile electrical system or a component thereof when electrical continuity exists. When the switch is closed, electrical current is supplied to the probe.

9 Claims, 3 Drawing Figures

CIRCUIT TESTER FOR AUTOMOTIVE ELECTRICAL SYSTEMS

BACKGROUND OF THE INVENTION

This invention relates to a circuit tester and more particularly to a circuit tester designed for use of automobile electrical systems.

Many types of circuit testers have been previously provided to test the continuity of electrical circuits in automobiles. Normally the testers comprise a hand held body member having an electrical probe extending from one end thereof and some form of electrical wire or lead extending from the other end which is connected to one of the battery terminals or to a ground connection on the automobile. A light is included in the conventional units which is illuminated when the probe is placed into electrical continuity with a component of the circuit when electrical continuity exists. A problem associated with the prior art devices is that electrical continuity will not be indicated if a proper ground connection is not achieved. The achievement of a proper ground connection is difficult in the newer automobiles due to the large number of plastic or nonmetal components thereof. A further problem associated with the prior art devices is that the testing of a circuit with the same is extremely laborious and time-consuming.

Therefore, it is a principal object of the invention to provide an improved circuit tester.

A further object of the invention is to provide a circuit tester for an automotive electrical system which may be placed in either a positive test mode or a negative test mode.

Still another object of the invention is to provide a circuit tester including means for supplying electrical current to the probe extending therefrom to facilitate and expedite circuit testing. Still another object of the invention is to provide a circuit tester including a continuity indicator light which also functions as a trouble light.

Still another object of the invention is to provide a circuit tester which includes a replaceable fuse assembly.

These and other objects will be apparent to those skilled in the art.

SUMMARY OF THE INVENTION

Figure 1:
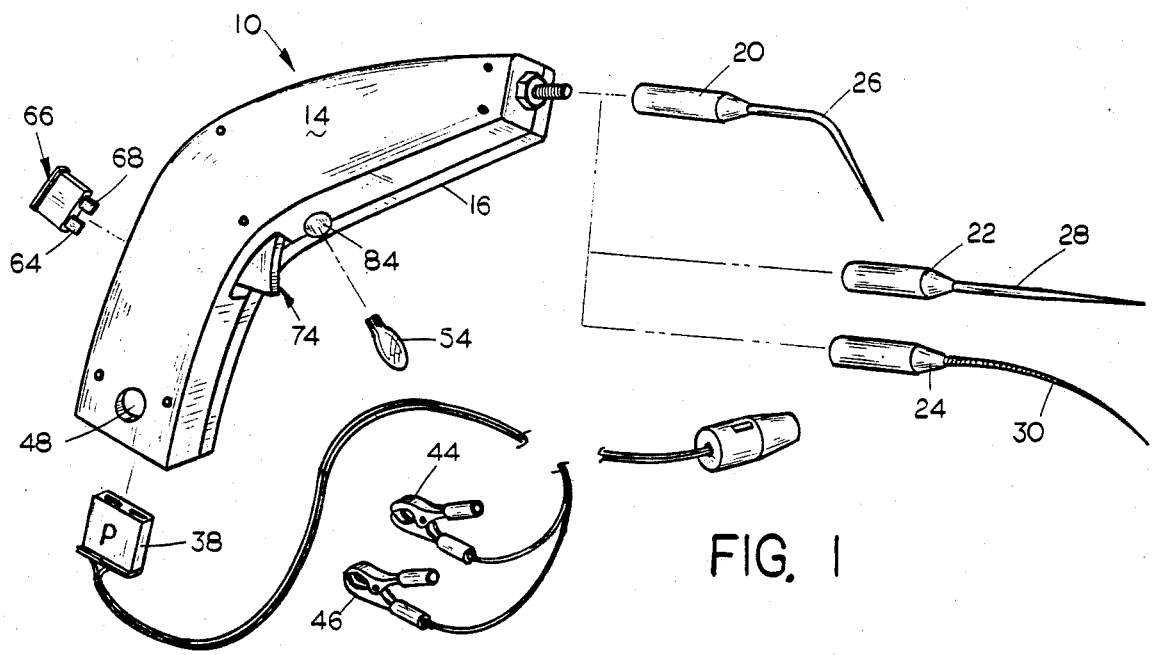
FIG. 1 is an exploded perspective view of the circuit tester of this invention with alternate probe embodiments being illustrated.
Figure 2:
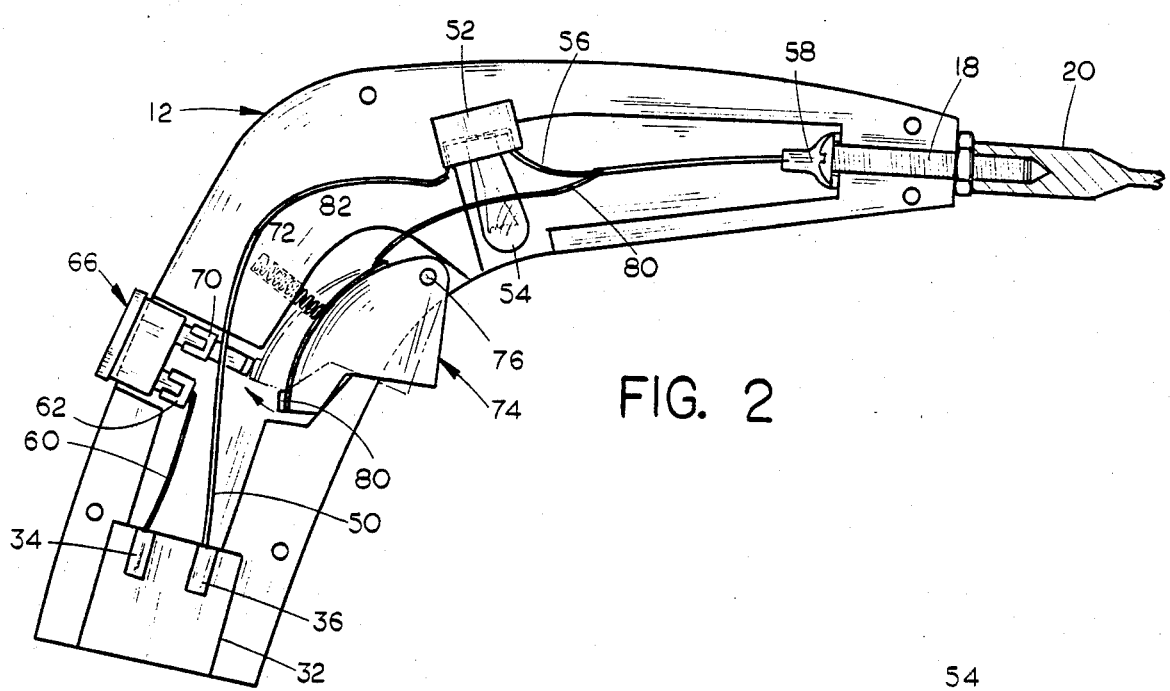
FIG. 2 is an elevational view of the circuit tester of this invention with portions thereof cut away to more fully illustrate the invention.
Figure 3:
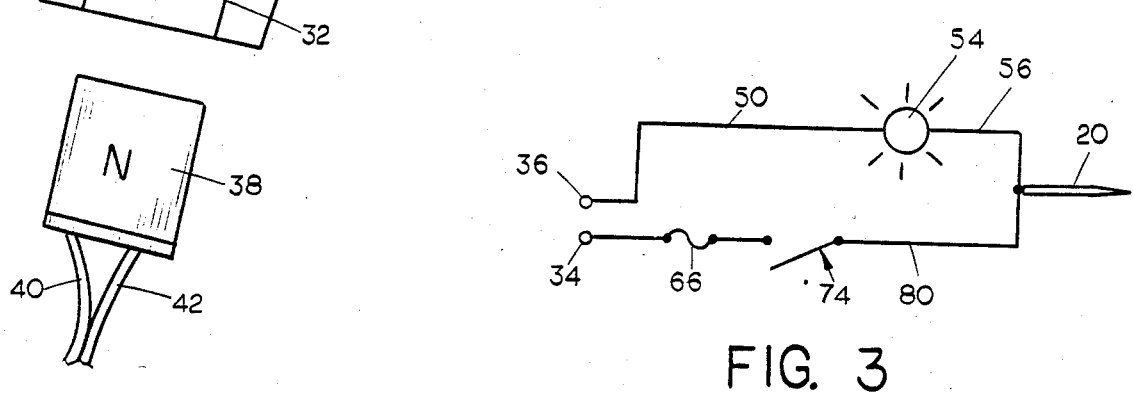
FIG. 3 is a schematic of the electrical circuitry of the circuit tester.

A hand-held circuit tester is described having an electrical socket at its base end which is adapted to reversibly receive an electrical plug provided on one end of an electrical lead which is connected to both terminals of the automobile battery. A first lead member extends from the socket to an electrically conductive probe provided at the other end of the tester and which has a light imposed therein. A second electrical lead member extends from the socket to the probe and has a normally open, manually operated switch imposed therein. The second lead also has a replaceable fuse assembly associated therewith. The plug on the electrical wire may be reversibly inserted into the socket to enable the tester to be placed in either a positive test mode or a negative test mode. When the switch is in its closed position, electrical current from the automobile battery will be supplied to the probe. The light will be illuminated when the switch is closed whether or not the probe is in electrical contact with a portion of the automobile electrical system or component thereof. The light will also be illuminated when the switch is open and the probe is in electrical contact with a portion of the automobile electrical system or a component thereof when electrical continuity exists.

DESCRIPTION OF THE PREFERRED EMBODIMENT

The numeral 10 refers to the circuit tester of this invention including a body member 12 which preferably is in the "pistol-grip" configuration illustrated in the drawings to facilitate ease of use. Body member 12 is comprised of a pair of body portions 14 and 16 which are secured together by any convenient means.

Body member 12 has a threaded stud 18 mounted in one end thereof which is adapted to threadably receive any of the probes 20, 22 or 24. Each of the probes 20, 22, and 24 are electrically conductive and have different shapes to permit the tester to be utilized in various areas in the automobile. Probe 20 includes an angularly extending tip 26 while the tip 28 of probe 22 is straight. Tip 30 of probe 24 is flexible to enable the probe to be positioned in "tight" locations.

Body member 12 has an electrical socket 32 at one end thereof having terminals 34 and 36. Socket 32 is adapted to reversibly detachably receive plug 38 mounted on one end of electrical wires or leads 40 and 42. Alligator clamps or clips 44 and 46 are provided at the other ends of the wires 40 and 42 and are adapted to be connected to the terminals or posts of the automobile battery. If desired, the clips 44 and 46 may be replaced by a single receptacle adapted to be inserted into the cigarette lighter of the vehicle. However, the preferred embodiment is the utilization of the clips 44 and 46. As seen in the drawings, plug 38 has the letter "N" on one side thereof and the letter "P" on the other side thereof. The letters "N" or "P" will appear in the opening of body member 12 depending upon the position of the plug 38 to indicate whether the tester is in a positive test mode or a negative test mode.

Lead member 50 is electrically connected to terminal 36 and extends to light socket 52 having light 54 removably mounted therein. Lead member 56 extends from socket 52 to connector 58 which is electrically connected to the stud 18. Lead member 60 is electrically connected to terminal 34 and extends to socket 62 adapted to receive prong 64 of replaceable fuse 66. Prong 68 of fuse 66 is removably received by socket 70 which has electrical contact 72 electrically connected thereto.

The numeral 74 refers to a normally open, manually operated switch in the form of a trigger pivotally connected to the body member at 76. Switch 74 is provided with an electrically conductive strip or terminal 78 having contact 80 at one end thereof which is adapted to be moved into electrical contact with the contact 72 when the switch 74 is pivotally moved to its closed position. Lead member 80 extends from the other end of the strip 78 and is electrically connected to the lead member 56 as illustrated. Spring 82 normally maintains the switch 74 in its open position. As seen in the drawings, body member 12 is provided with an opening 84 formed therein to permit the light of bulb 54 to be inserted therein. The opening 84 also serves an additional function in that light from the bulb 54 will pass outwardly through the opening to enable the device to also serve as a trouble light as desired.

In the positive test mode, the probe 20 may be placed into contact with a fuse, motor, electrical wire, etc. to enable the tester to test for a positive voltage source or to enable the switch 74 to be closed to supply a positive voltage source. Conversely, in the negative test mode, the tester can be used to test for a negative voltage source or to supply a negative voltage source when the switch 74 is closed.

If the tester is to be used to test a blower fan motor in the automotive electrical circuit, the tester would be placed in the positive test mode or negative test mode depending upon the particular electrical system of the automobile. Assuming that the fan blower does not work, the trouble could exist at any one or more points from the automobile battery to the fan. The circuit tester 10 is placed in the positive test mode. The switch 74 is then closed and if the indicator light 54 is illuminated, the tester and the vehicle battery are functional. The probe 20 is then placed in the circuit at the fuse and if the indicator light 54 is illuminated, the problem exists farther in the circuit. If the indicator light 54 does not light, tester switch 74 is closed thereby supplying positive voltage to the circuit. If the fan motor operates with the switch 74 closed, the electrical problem exists between the fuse and the battery. If the fan does not run with the switch 74 closed, the problem is farther along the circuit. The circuit is then tested in this manner along the circuit testing points in the circuit moving toward the fan motor. If the circuit tests good to the fan motor but the fan does not run, the tester should be switched to the negative test mode. The probe 20 is then touched to the fan motor ground lead. If the light 54 is illuminated, the motor is properly grounded and the fan motor is defective. If the indicator does not light, the switch 74 is closed thereby grounding the fan motor. If the fan motor runs, it will be necessary to repair the ground circuit to the fan motor.

In the situation just described, the operator could initially touch the probe 22 to the terminals of the fan motor and supply electrical power thereto by means of the switch 74. If the fan motor runs at this stage with the switch 74 closed, the operator will know that it is not the fan motor that is defective but is in the circuit between the fan motor and the automobile battery. In the conventional prior art devices, it is not possible to supply voltage to the probe. In the same situation, if a conventional prior art device was utilized, electrical contact of the probe of the prior art device with the terminal of the fan motor would only indicate that continuity did not exist.

Thus it can be seen that a novel circuit tester has been provided which may be selectively positioned in either a positive test mode or a negative test mode. It can also be seen that a novel circuit tester has been provided wherein it is possible to supply either a negative power source or a positive power source to the probe to expedite the testing procedure. The utilization of a pair of spring clips or clamps directly connected to the battery terminals insures that a proper ground is always achieved.

Thus it can be seen that the circuit tester of this invention accomplishes at least all of its stated objectives.

I claim:

1. A circuit tester for automotive electrical systems, comprising,
    a body member having opposite ends and a grip portion therebetween,
    an electrical conductive probe extending from one end of said body member,
    a pair of electrical leads secured to said body member, each of said leads being adapted to be operatively electrically connected to one of the terminals of the battery of the automobile,
    an electric circuit in said body portion connecting said leads with said probe,
    said circuit comprising a first lead member connected to and extending from one of said leads to said probe, said first lead member having a light series connected thereto; a second lead member connected to and extending from the other of said leads to said probe, said second lead member having a normally open, manually operated switch imposed therein which may be selectively closed to supply electrical current to said probe,
    said light being illuminated when said switch is closed whether or not said probe is in electrical contact with a portion of the automobile electrical system or components thereof,
    said light being illuminated when said switch is open and said probe is in electrical contact with a portion of the automobile electrical system or a component thereof when electrical continuity to said portion or component exists.

2. The tester of claim 1 wherein a replaceable fuse means is imposed in said second lead member.

3. The tester of claim 1 wherein said body member is "pistol-grip" shaped.

4. The tester of claim 1 wherein said probe is flexible.

5. The tester of claim 1 wherein said probe is angularly shaped.

6. The tester of claim 1 wherein said probe is selectively removably mounted on said body member.

7. The tester of claim 1 wherein said body member has an electrical socket provided therein which is connected to said first and second lead members, said electrical lead means having an electrical plug at one end thereof which is selectively reversibly receivable by said socket to enable the tester to be placed in either a positive test mode or a negative test mode.

8. The tester of claim 1 wherein said lead means has spring-loaded clamps for attachment to the terminals of the battery.

9. The tester of claim 1 wherein said light means is positioned on said body member so that it also functions as an auxiliary light source for the person using the tester.

* * * * *